(12) United States Patent
Lee et al.

(10) Patent No.: US 10,886,377 B2
(45) Date of Patent: Jan. 5, 2021

(54) POWER SEMICONDUCTOR DEVICE AND MANUFACTURING METHOD THEREOF

(71) Applicant: HYUNDAI AUTRON CO., LTD., Seoul (KR)

(72) Inventors: Ju Hwan Lee, Seongnam-si (KR); Tae Young Park, Gunpo-si (KR); Hyuk Woo, Incheon (KR); Min Gi Kang, Seoul (KR); Young Joon Kim, Yongin-si (KR); Tae Youp Kim, Seoul (KR); Seong-hwan Yun, Seoul (KR); Seon-hyeong Jo, Seoul (KR); Jeong Mok Ha, Seoul (KR)

(73) Assignee: HYUNDAI AUTRON CO., LTD., Seoul (KR)

( * ) Notice: Subject to any disclaimer, the term of this patent is extended or adjusted under 35 U.S.C. 154(b) by 17 days.

(21) Appl. No.: 16/429,344

(22) Filed: Jun. 3, 2019

(65) Prior Publication Data

US 2019/0393316 A1  Dec. 26, 2019

(30) Foreign Application Priority Data

Jun. 21, 2018 (KR) .......................... 10-2018-0071618

(51) Int. Cl.
| | |
|---|---|
| *H01L 29/66* | (2006.01) |
| *H01L 29/423* | (2006.01) |
| *H01L 29/06* | (2006.01) |
| *H01L 29/739* | (2006.01) |

(52) U.S. Cl.
CPC ...... *H01L 29/4238* (2013.01); *H01L 29/0696* (2013.01); *H01L 29/4236* (2013.01); *H01L 29/7397* (2013.01)

(58) Field of Classification Search
USPC ......................................................... 257/139
See application file for complete search history.

(56) References Cited

U.S. PATENT DOCUMENTS

| | | | | |
|---|---|---|---|---|
| 6,107,650 | A * | 8/2000 | Takahashi | ............. H01L 25/072 257/139 |
| 2002/0038887 | A1* | 4/2002 | Ninomiya | ......... H01L 29/66348 257/336 |
| 2012/0292662 | A1* | 11/2012 | Matsuura | .......... H01L 29/66348 257/139 |

(Continued)

FOREIGN PATENT DOCUMENTS

KR    10-2017-0143390 A    12/2017

*Primary Examiner* — Niki H Nguyen
(74) *Attorney, Agent, or Firm* — Morgan, Lewis & Bockius LLP

(57) ABSTRACT

The power semiconductor device includes: a first trench gate and a second trench gate in a stripe shape extending in one direction in parallel and spaced apart from each other in a substrate; a third trench gate in a ladder shape extending in a direction different from the one direction between the first trench gate and the second trench gate in the substrate; a first conductive type body area each disposed between the first trench gate, the second trench gate and the third trench gate, respectively, in the substrate; a pair of first conductive type floating first areas surrounding each of bottom surfaces and at least one side of the first trench gate and the second trench gate in the substrate; and a first conductive type floating second area surrounding a bottom surface of the third trench gate in the substrate.

9 Claims, 7 Drawing Sheets

(56) References Cited

U.S. PATENT DOCUMENTS

2013/0200451 A1* 8/2013 Yilmaz ............... H01L 29/0865
                                                        257/331
2016/0365434 A1* 12/2016 Kobayashi ............. H01L 29/78
2017/0054010 A1* 2/2017 Matsuura ............. H01L 29/407
2017/0352725 A1* 12/2017 Kim .................. H01L 29/66348
2017/0365696 A1* 12/2017 Kim .................... H01L 29/0619

* cited by examiner

X-AXIS, Y-AXIS

X-AXIS

Y-AXIS

POWER SEMICONDUCTOR DEVICE AND MANUFACTURING METHOD THEREOF

CROSS-REFERENCE TO RELATED APPLICATIONS

This application claims priority to Korean Patent Application No. 10-2018-0071618 filed on Jun. 21, 2018, and all the benefits accruing therefrom under 35 U.S.C. § 119, the contents of which are incorporated by reference in their entirety.

BACKGROUND

The present invention relates to a power semiconductor device and a manufacturing method thereof, and more particularly, to an Insulated Gate Bipolar Transistor (IGBT) device and a manufacturing method thereof.

An Insulated Gate Bipolar Transistor (IGBT) is a result of Metal Oxide Silicon (MOS) and bipolar technology and has been applied to applications that can not be realized with thyristors, bipolar transistors, MOSFETs, etc., due to low forward loss and high speed and is a next-generation power semiconductor device that is essential for high-efficiency, high-speed power systems that are widely used in the voltage range of 300V or more. In relation to a switching device after the development of power MOSFETs in the 1970s, MOSFETs are used in a range where high-speed switching is required and a bipolar transistor, a thyristor, a GTO, or the like has been used in a range where a large amount of current conduction is required at a medium voltage to a high voltage. The IGBT developed in the early 1980s has more current capability than bipolar transistors in terms of output characteristics and has gate drive characteristics like MOSFETs in terms of input characteristics so that high-speed switching of about 100 KHz is possible. Therefore, since the IGBT creates new application systems in addition to replacement devices of MOSFETs, bipolar transistors, and thyristors, it is gradually expanding its use range from industrial to home electronics.

A related prior art is Korean Laid-Open Publication No. 20140057630 (published on May 13, 2014, entitled "IGBT and its manufacturing method").

SUMMARY

It is an object of the present invention to provide a power semiconductor device capable of stabilizing switching characteristics and securing a high channel density. However, these problems are illustrative, and the scope of the present invention is not limited thereto.

An embodiment of the inventive concept provides a power semiconductor device including: a first trench gate and a second trench gate in a stripe shape extending in one direction in parallel and spaced apart from each other in a substrate; a third trench gate in a ladder shape extending in a direction different from the one direction between the first trench gate and the second trench gate in the substrate; a first conductive type body area each disposed between the first trench gate, the second trench gate and the third trench gate, respectively, in the substrate; a pair of first conductive type floating first areas surrounding each of bottom surfaces and at least one side of the first trench gate and the second trench gate in the substrate; a first conductive type floating second area surrounding a bottom surface of the third trench gate in the substrate; an emitter electrode disposed on an upper surface of the substrate and in contact with the first conductive type body area; and a collector electrode disposed on a bottom surface of the substrate.

In an embodiment, a first trench gate and a second trench gate constituting one unit cell may be connected to a first trench gate and a second trench gate constituting another unit cell immediately adjacent to the one unit cell without being separated from each other.

In an embodiment, in a plurality of unit cells disposed in series being adjacent to each other, the first trench gates may be connected as one and provided across the plurality of unit cells, the second trench gates may be connected as one and provided across the plurality of unit cells, and the third trench gate may be provided as a plurality of trench gates connecting one of the first trench gates and one of the second trench gates and spaced apart from each other between one of the first trench gates and one of the second trench gates.

In an embodiment, the power semiconductor device may further include a second conductive type drift area disposed between the first conductive type floating area, the first conductive type body area, and the collector electrode in the substrate.

In an embodiment, the power semiconductor device may further include a second conductive type field stop area disposed between the second conductive type drift area and the collector electrode.

In an embodiment, the power semiconductor device may further include a pair of second conductive type source areas spaced apart from each other and respectively adjacent to the first trench gate and the second trench gate in a first conductive type body area disposed between the first trench gate and the second trench gate.

In an embodiment, a doping maximum depth of the first conductive type body area disposed between the first trench gate and the second trench gate may be shallower than a depth of the first trench gate and the second trench gate, and a doping maximum depth of the floating first area of the first conductive type may be deeper than a depth of the first trench gate and the second trench gate.

In an embodiment, a second conductive type doping concentration between the pair of first conductive type floating first areas and between the first trench gate and the second trench gate may be relatively higher than a second conductive type doping concentration below the pair of first conductive type floating first areas in the drift area.

In an embodiment, the second conductive type and the first conductive type may have a conductive type opposite to each other, and are any one of n-type and p-type.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the present invention are described in more detail with reference to the accompanying drawings. However, the present invention may be embodied in different forms and should not be construed as limited to the embodiments set forth herein, and rather, these embodiments are provided so that this disclosure will be thorough and complete, and will fully convey the scope of the present invention to those skilled in the art. Also, at least some of the components may be exaggerated or reduced in size for convenience of explanation. Like numbers refer to like elements throughout the drawings.

In this specification, the term "transverse section" refers to a cross section in the direction parallel to the upper surface of the substrate, and the term "vertical cross section" refers to a longitudinal section in the direction perpendicular to the upper surface of the substrate.

In this specification, the first conductive type and the second conductive type have opposite conductive types, and may be any of n-type and p-type, respectively. For example, the first conductive type may be p-type and the second conductive type may be n-type, and the conductive type configuration is exemplarily illustrated in the accompanying drawings. However, the technical idea of the present invention is not limited thereto. For example, the first conductive type may be n-type and the second conductive type may be p-type.

Figure 1:
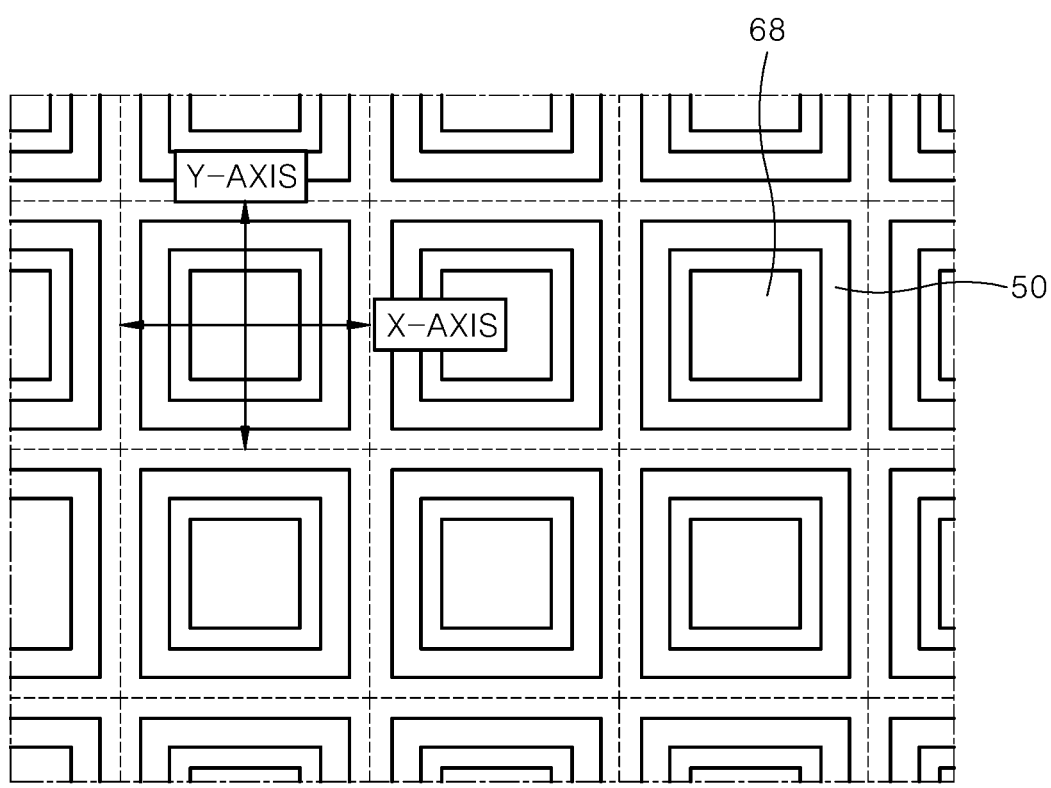
FIG. 1 is a transverse section diagram conceptually illustrating a cell structure of a power semiconductor device according to a comparative example of the present invention.
Figure 2:
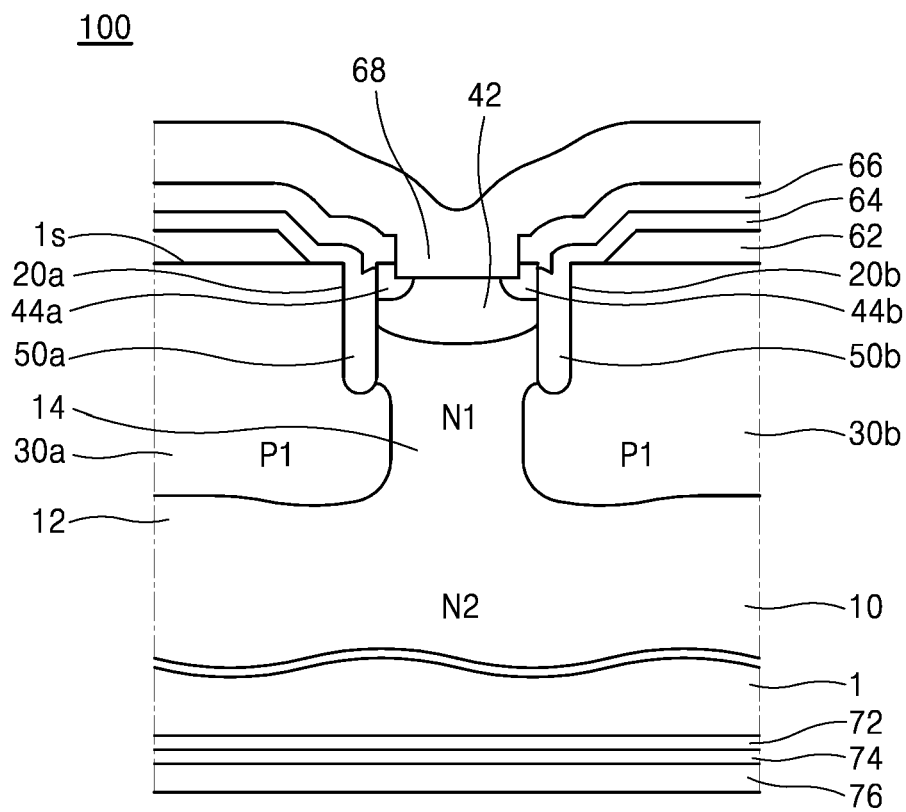
FIG. 2 is a longitudinal section along the X-axis and the Y-axis shown in FIG. 1.
Figure 3:
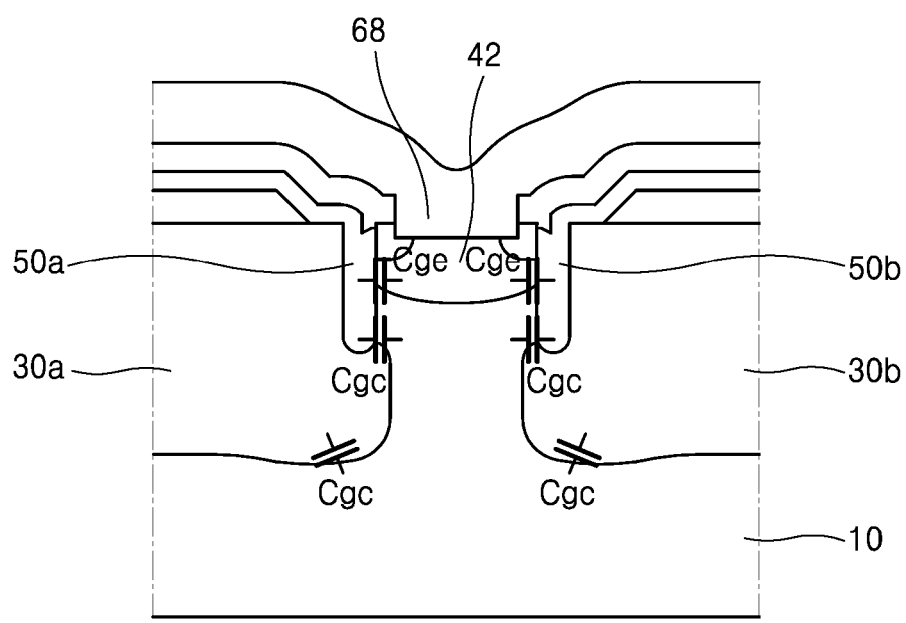
FIG. 3 is a simulation image showing an aspect of parasitic capacitance occurring in a longitudinal section along the X-axis and the Y-axis shown in FIG. 1.
Figure 4:
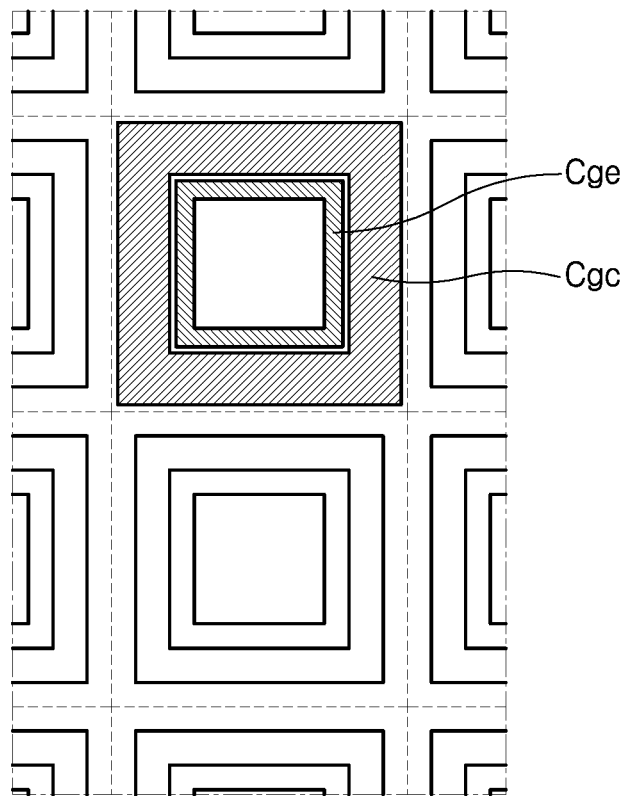
FIG. 4 is an enlarged view of an area where parasitic capacitance is generated as part of the unit cells shown in FIG. 1.

FIG. 1 is a transverse section diagram conceptually illustrating a cell structure of a power semiconductor device according to a comparative example of the present invention. FIG. 2 is a longitudinal section along the X-axis and the Y-axis shown in FIG. 1. FIG. 3 is a simulation image showing an aspect of parasitic capacitance occurring in a longitudinal section along the X-axis and the Y-axis shown in FIG. 1. FIG. 4 is an enlarged view of an area where parasitic capacitance is generated as part of the unit cells shown in FIG. 1.

The power semiconductor device shown in FIGS. 1 to 4 has a closed cell structure in the active structure of the insulated bipolar transistor (IGBT). The area defining the unit cell in the closed cell structure may vary according to the reference point. If a unit cell is defined around the emitter electrode 68, the trench gate 50 formed in the unit cell has a closed square shape, and a trench gate formed in one unit cell and a trench gate formed in another unit cell adjacent to the unit cell are provided separately without being connected.

The power semiconductor device 100 according to the comparative example of the present invention includes a pair of gate electrodes 50a and 50b respectively disposed in the first trench 20a and the second trench 20b spaced apart from each other in the substrate 1. Here, the substrate 1 can be understood as meaning a wafer and an epitaxial layer epitaxially grown on the wafer.

The power semiconductor device 100 according to the comparative example of the present invention includes a first conductive type body area 42 disposed between the first trench 20a and the second trench 20b in the substrate 1, and a pair of source areas 44a and 44b of a second conductive type disposed adjacent to and spaced apart from the first trench 20a and the second trench 20b, respectively, in the body area 42 of the first conductive type.

The power semiconductor device 100 according to the comparative example of the present invention includes a floating area 30a of the first conductive type surrounding the bottom surface and at least one side surface of the first trench 20a in the substrate 1, and includes a floating area 30b of a first conductive type surrounding the bottom surface and at least one side surface of the first trench 20b. A pair of floating areas 30a and 30b of the first conductive type are disposed apart from each other in the substrate 1. With reference to the upper surface is of the substrate 1, the depth to the bottom surface of the floating areas 30a and 30b is deeper than the depth to the bottom surface of the first trench 20a and the second trench 20b. That is, the maximum doping depth of the floating areas 30a and 30b of the first conductive type may be deeper than the depths of the first trench 20a and the second trench 20b.

The power semiconductor device 100 according to a comparative example of the present invention includes a second conductive type drift area 10 that passes between 14 a pair of first conductive type floating areas 30a and 30b from a bottom 12 of the pair of first conductive type floating areas 30a and 30b in the substrate 1, and extends to a first conductive type body area 42. In particular, the second conductive type doping concentration N1 between the pair of first conductive type floating areas 30a and 30b in the drift area 10 is relatively higher than the second conductive type doping concentration N2 below the pair of first conductive type floating areas 30a and 30b.

On the other hand, the maximum doping depth of the body area 42 of the first conductive type is shallower than the depth of the first trench 20a and the second trench 20b, and the maximum doping depth of the first conductive type floating areas 30a and 30b may be deeper than the depths of the first trench 20a and the second trench 20b. Here, the second conductive type doping concentration between the pair of first conductive type floating areas 30a and 30b in the drift area 10 and between the first trench 20a and the second trench 20b may be relatively higher than the second conductive type doping concentration below the first conductive type floating areas 30a and 30b.

A conductive pattern 64 electrically connected to the gate electrodes 50a and 50b and a conductive pattern 68 electrically connected to the source areas 44a and 44b and the body area 42 are formed on the substrate 1. In particular, the conductive pattern 68 electrically connected to the source areas 44a and 44b and the body area 42 may serve as an emitter electrode or a contact. Furthermore, insulating patterns 62 and 66 may be provided for electrical insulation.

A field stop area 72 may be provided on the lower surface of the substrate 1 opposite to the upper surface. The field stop area 72 may be an area highly doped with the second conductive type impurity. For example, the second conductive type impurity concentration in the field stop area 72 may be higher than the second conductive type impurity concentration in the drift area 10 of the second conductive type. A collector area 74 may be provided below the field stop area 72. The collector area 74 may be an area doped with the second conductive type impurity. A collector electrode 76 may be provided below the collector area 74.

If the floating areas 30a and 30b do not exist to the bottom of the trenches 20a and 20b, the electric field increases at the bottom of the trenches 20a and 20b. In a case where the floating areas 30a and 30b exist only to the bottom of the trenches 20a and 20b, when the spacing distance between the trenches 20a and 20b in the MOSFET in the direction of supplying the base current of the IGBT is reduced, the base current path is limited by the diffusion of the first conductive type impurity and the cell pitch can not be reduced below a certain distance.

In the power semiconductor device 100 shown in FIG. 2, since the second conductive type doping concentration N1 distributed between 14 the pair of first conductive type floating areas 30a and 30b is relatively higher than the second conductive type doping concentration N2 distributed below the first conductive type floating areas 30a and 30b, even though the spacing distance between the trenches 20a and 20b becomes narrow, a base current supply path is formed and supplies a rich base current, and balance between N1 and P1 is formed to form the maximum electric field on the bottom surface of the floating areas 30a and 30b, thereby enhancing robustness.

That is, when the spacing distance F between the trenches in the MOSFET in the direction of supplying the base current of the IGBT is reduced, the phenomenon that the first conductive impurities of the floating areas 30a and 30b are diffused and the base current path is limited can be improved by forming the area N1. Also, according to the configuration of the power semiconductor device 100 described above, a higher cell density is formed with the narrower spacing distance F when assuming the same transconductance to mitigate local temperature rise, so that the short-circuit characteristics can be improved.

In addition to improving IGBT resistance and short-circuit characteristics with this principle, simultaneously, the second conductive type impurity concentration N1 of the area 14 and the total amount of charge of the first conductive type impurity concentration P1 of the floating areas 30a and 30b are adjusted so that the maximum electric field is formed on the bottom surfaces of the floating areas 30a and 30b, thereby improving the robustness. Here, the bottom surfaces of the floating areas 30a and 30b where the maximum electric field is formed are lower than the bottom surfaces of the trenches 20a and 20b.

When simplifying the relationship between the static electric field and the amount of charge in N type depletion at the time of voltage application into one dimension in C direction, it may be $dE/dx=(1/\varepsilon)*n$ and seen as a function of N doping only. However, When the carrier is injected during the IGBT operation, it changes to $dE/dx=(1/\varepsilon)*(n+h-e)$ due to the influence on the amount of charge injected. When the hole density is excessive in the section G in the turn-off state, in the general structure, due to the electric field change rate increase by the change in the hole concentration, the electric field area decreases at the same maximum electric field, so that an internal pressure decrease occurs abruptly. However, in the structure of the present invention, an electric field change rate negative section is formed between the bottom surfaces of the trenches 20a, 20b and the bottom surface of the body area 42. Therefore, when the slope of the electric field increases, the electric field area increases so that the dynamic internal pressure decrease is alleviated.

The power semiconductor device having the closed cell structure described above has advantages in terms of switching and robustness, but has a disadvantage in terms of static characteristics. That is, it affects the switching operation characteristics depending on the size and ratio of the parasitic capacitances Cge, Cgc, Cce, and etc. of the closed cell in the active structure of the IGBT.

Referring to FIG. 3, the aspect of the parasitic capacitance generated in each longitudinal section along the X-axis and the Y-axis shown in FIG. 1 illustrating a power semiconductor device having a closed cell structure can be confirmed. According thereto, the gate-emitter parasitic capacitance Cge is generated in an area including the interface between the gate electrodes 50a and 50b and the body area 42, and the gate-collector parasitic capacitance Cgc is generated in an area including the interface between the gate electrodes 50a and 50b and the drift area 10. In an area including the interface between the floating areas 30a and 30b located at the lower ends of the gate electrodes 50a and 50b and the drift area 10, the gate-collector parasitic capacitance Cgc occurs.

Referring to FIG. 4, the aspect of the parasitic capacitance generated in the transverse section of the device can be confirmed by enlarging a partial area shown in FIG. 1 illustrating a power semiconductor device having a closed cell structure. According thereto, it can be confirmed that over an area including the interface between the gate electrode 50 and the emitter electrode 68, the gate-emitter parasitic capacitance Cge is generated along the shape of the closed cell, and over an area where the gate electrode 50 is located, the gate-collector parasitic capacitance Cgc is generated along the shape of the closed cell.

In relation to these parasitic capacitances Cge, Cgc, Cce, and etc. shown in FIGS. 3 and 4, if the size and/or the ratio of the components are not controlled, the switch characteristic becomes unstable and the channel density becomes low.

Figure 5:
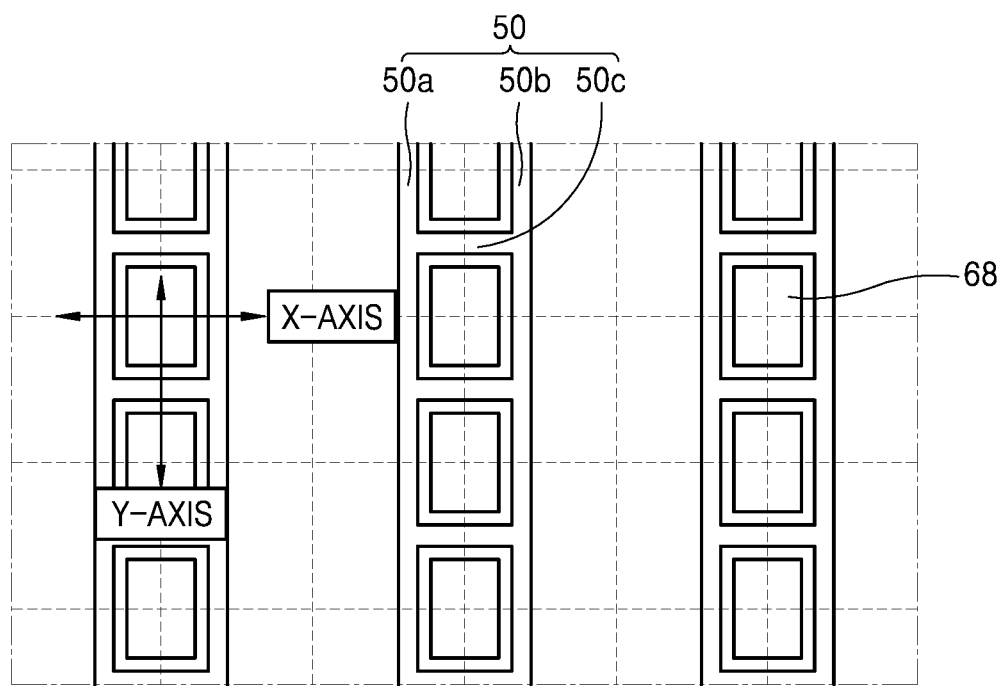
FIG. 5 is a transverse section diagram conceptually illustrating a cell structure of a power semiconductor device according to an embodiment of the present invention.
Figure 6:
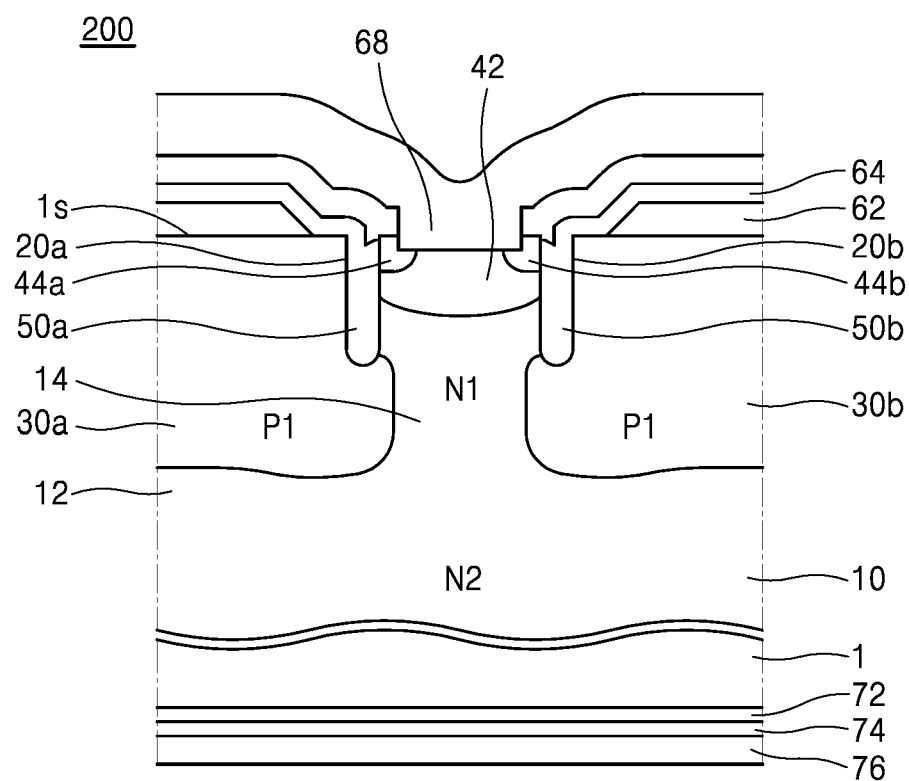
FIG. 6 is a longitudinal section along the X-axis shown in FIG. 5.
Figure 7:
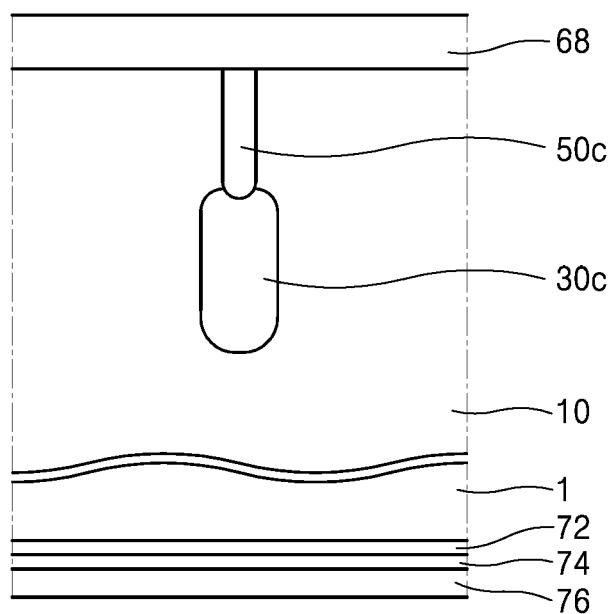
FIG. 7 is a transverse section along the X-axis shown in FIG. 5.
Figure 8:
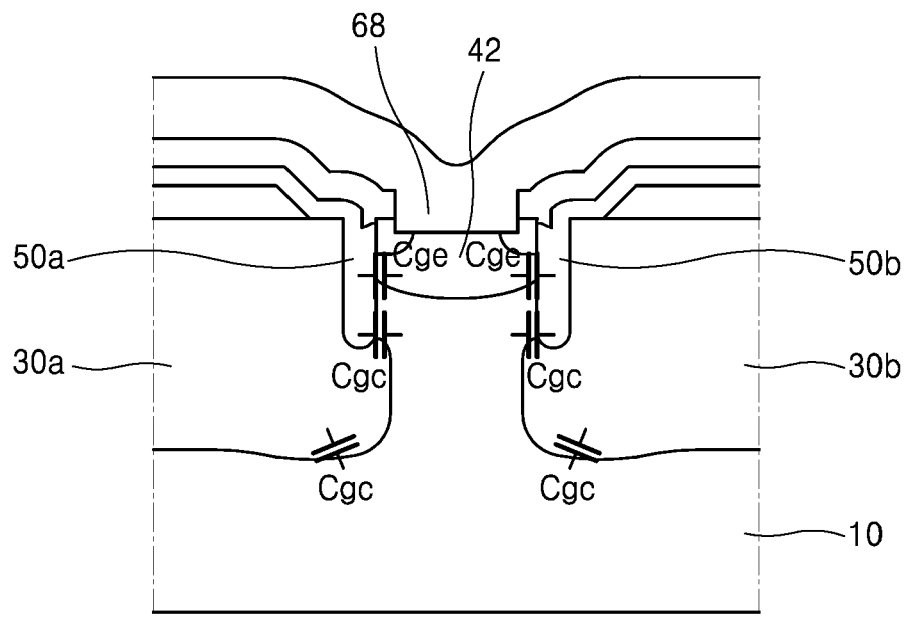
FIG. 8 is a simulation image showing an aspect of parasitic capacitance occurring in a longitudinal section along the X-axis shown in FIG. 5.
Figure 9:
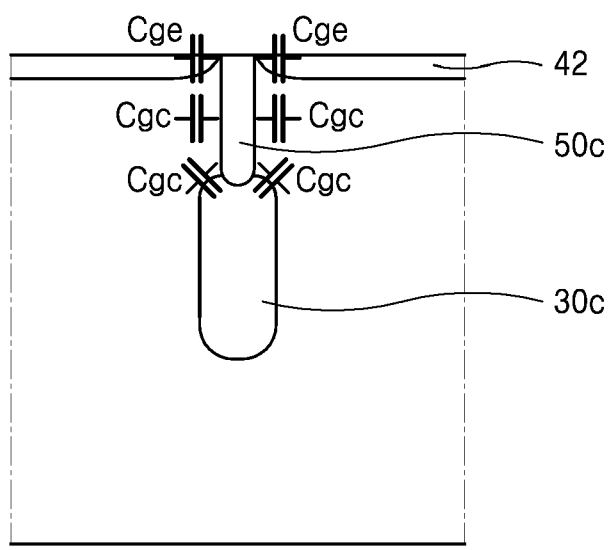
FIG. 9 is a simulation image showing an aspect of parasitic capacitance occurring in a longitudinal section along the Y-axis shown in FIG. 5.
Figure 10:
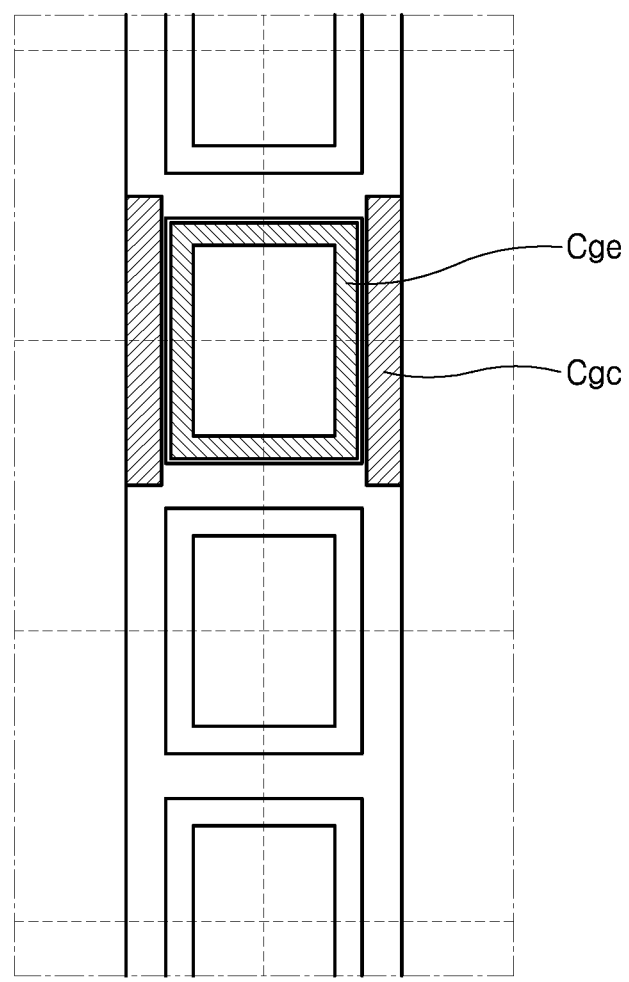
FIG. 10 is an enlarged view of an area where parasitic capacitance is generated as part of the unit cells shown in FIG. 5.

FIG. 5 is a transverse section diagram conceptually illustrating a cell structure of a power semiconductor device according to an embodiment of the present invention. FIG. 6 is a longitudinal section along the X-axis shown in FIG. 5. FIG. 7 is a transverse section along the X-axis shown in FIG. 5. FIG. 8 is a simulation image showing an aspect of parasitic capacitance occurring in a longitudinal section along the X-axis shown in FIG. 5. FIG. 9 is a simulation image showing an aspect of parasitic capacitance occurring in a longitudinal section along the Y-axis shown in FIG. 5. FIG. 10 is an enlarged view of an area where parasitic capacitance is generated as part of the unit cells shown in FIG. 5.

A power semiconductor device according to an embodiment of the present invention shown in FIGS. 5 to 10 includes a structure in which a closed cell structure and a stripe cell structure are fused to optimize the size and the ratio of the parasitic capacitors as an active structure of an IGBT. The area defining the unit cell in the fusion structure may vary according to the reference point. If a unit cell is defined around the emitter electrode 68, the trench gate 50 formed in the unit cell has a closed square shape, and a trench gate formed in one unit cell and a trench gate formed in another unit cell adjacent to the unit cell are provided in connection without being separated.

Depending on an active structure of a power semiconductor device according to an embodiment of the present invention, in a plurality of unit cells arranged in series adjacent to each other, the first trench gates 50a are connected as one and provided and extend in one direction (e.g., a direction parallel to the Y-axis) across the plurality of unit cells. The second trench gates 50b are connected as one and provided and extend in one direction (for example, in a direction parallel to the Y-axis) across the plurality of unit cells. The third trench gate 50c connects one of the first trench gates 50a and one of the second trench gates 50b between one of the first trench gates 50a and one of the second trench gates 50b and is provided as a plurality of spaced trench gates extending in a direction different from the one direction (for example, a direction parallel to the X axis).

Referring to FIG. 6 illustrating a longitudinal section along the X-axis shown in FIG. 5, the power semiconductor device 200 according to an embodiment of the present invention includes a pair of gate electrodes 50a and 50b respectively disposed in the first trench 20a and the second trench 20b spaced apart from each other in the substrate 1. The pair of gate electrodes 50a and 50b can be understood as a first trench gate 50a and a second trench gate 50b. Here, the substrate 1 can be understood as meaning a wafer and an epitaxial layer epitaxially grown on the wafer.

The power semiconductor device 200 according to an embodiment of the present invention includes a first conductive type body area 42 disposed between the first trench 20a and the second trench 20b in the substrate 1, and a pair of source areas 44a and 44b of a second conductive type disposed adjacent to and spaced apart from the first trench 20a and the second trench 20b, respectively, in the body area 42 of the first conductive type.

The power semiconductor device 200 according to an embodiment of the present invention includes a floating area 30a of the first conductive type surrounding the bottom surface and at least one side surface of the first trench 20a in the substrate 1, and includes a floating area 30b of a first conductive type surrounding the bottom surface and at least one side surface of the first trench 20b. A pair of floating areas 30a and 30b of the first conductive type are disposed apart from each other in the substrate 1. With reference to the upper surface is of the substrate 1, the depth to the bottom surface of the floating areas 30a and 30b is deeper than the depth to the bottom surface of the first trench 20a and the second trench 20b. That is, the maximum doping depth of the floating areas 30a and 30b of the first conductive type may be deeper than the depths of the first trench 20a and the second trench 20b.

The power semiconductor device 200 according to an embodiment of the present invention includes a second conductive type drift area 10 that passes between 14 a pair of first conductive type floating areas 30a and 30b from a bottom 12 of the pair of first conductive type floating areas 30a and 30b in the substrate 1, and extends to a first conductive type body area 42. In particular, the second conductive type doping concentration N1 between the pair of first conductive type floating areas 30a and 30b in the drift area 10 is relatively higher than the second conductive type doping concentration N2 below the pair of first conductive type floating areas 30a and 30b.

On the other hand, the maximum doping depth of the body area 42 of the first conductive type is shallower than the depth of the first trench 20a and the second trench 20b, and the maximum doping depth of the first conductive type floating areas 30a and 30b may be deeper than the depths of the first trench 20a and the second trench 20b. Here, the second conductive type doping concentration between the pair of first conductive type floating areas 30a and 30b in the drift area 10 and between the first trench 20a and the second trench 20b may be relatively higher than the second conductive type doping concentration below the first conductive type floating areas 30a and 30b.

A conductive pattern 64 electrically connected to the gate electrodes 50a and 50b and a conductive pattern 68 electrically connected to the source areas 44a and 44b and the body area 42 are formed on the substrate 1. In particular, the conductive pattern 68 electrically connected to the source areas 44a and 44b and the body area 42 may serve as an emitter electrode or a contact. Furthermore, insulating patterns 62 and 66 may be provided for electrical insulation.

A field stop area 72 may be provided on the lower surface of the substrate 1 opposite to the upper surface. The field stop area 72 may be an area highly doped with the second conductive type impurity. For example, the second conductive type impurity concentration in the field stop area 72 may be higher than the second conductive type impurity concentration in the drift area 10 of the second conductive type. A collector area 74 may be provided below the field stop area 72. The collector area 74 may be an area doped with the second conductive type impurity. A collector electrode 76 may be provided below the collector area 74.

If the floating areas 30a and 30b do not exist to the bottom of the trenches 20a and 20b, the electric field increases at the bottom of the trenches 20a and 20b. In a case where the floating areas 30a and 30b exist only to the bottom of the trenches 20a and 20b, when the spacing distance between the trenches 20a and 20b in the MOSFET in the direction of supplying the base current of the IGBT is reduced, the base current path is limited by the diffusion of the first conductive type impurity and the cell pitch can not be reduced below a certain distance.

In the power semiconductor device 200 shown in FIG. 6, since the second conductive type doping concentration N1 distributed between 14 the pair of first conductive type floating areas 30a and 30b is relatively higher than the second conductive type doping concentration N2 distributed below the first conductive type floating areas 30a and 30b, even though the spacing distance between the trenches 20a and 20b becomes narrow, a base current supply path is formed and supplies a rich base current, and balance between N1 and P1 is formed to form the maximum electric field on the bottom surface of the floating areas 30a and 30b, thereby enhancing robustness.

That is, when the spacing distance F between the trenches in the MOSFET in the direction of supplying the base current of the IGBT is reduced, the phenomenon that the first conductive impurities of the floating areas 30a and 30b are diffused and the base current path is limited can be improved by forming the area N1. Also, according to the configuration of the power semiconductor device 200 described above, a higher cell density is formed with the narrower spacing distance F when assuming the same transconductance to mitigate local temperature rise, so that the short-circuit characteristics can be improved.

In addition to improving IGBT resistance and short-circuit characteristics with this principle, simultaneously, the second conductive type impurity concentration N1 of the area 14 and the total amount of charge of the first conductive type impurity concentration P1 of the floating areas 30a and 30b are adjusted so that the maximum electric field is formed on the bottom surfaces of the floating areas 30a and 30b, thereby improving the robustness. Here, the bottom surfaces of the floating areas 30a and 30b where the maximum electric field is formed are lower than the bottom surfaces of the trenches 20a and 20b.

When simplifying the relationship between the static electric field and the amount of charge in N type depletion at the time of voltage application into one dimension in C direction, it may be dE/dx=(1/ε)*n and seen as a function of N doping only. However, When the carrier is injected during the IGBT operation, it changes to dE/dx=(1/ε)*(n+h−e) due to the influence on the amount of charge injected. When the hole density is excessive in the section G in the turn-off state, in the general structure, due to the electric field change rate increase by the change in the hole concentration, the electric field area decreases at the same maximum electric field, so that an internal pressure decrease occurs abruptly. However, in the structure of the present invention, an electric field change rate negative section is formed between the bottom surfaces of the trenches 20a, 20b and the bottom surface of the body area 42. Therefore, when the slope of the electric field increases, the electric field area increases so that the dynamic internal pressure decrease is alleviated.

On the other hand, referring to FIG. 7 illustrating a longitudinal section along the Y-axis shown in FIG. 5, the power semiconductor device 200 according to an embodiment of the present invention includes a third trench gate 50c in the form of a ladder extending in a direction different from the one direction between the first trench gate 50a and the second trench gate 50b in the substrate 1. In addition, the power semiconductor device 200 according to an embodiment of the present invention includes a floating second area 30c of a first conductive type surrounding the bottom surface of the third trench gate 50c in the substrate 1. Although not shown in FIG. 7, it may further include a first conductive type body area each disposed between the first trench gate 50a and the third trench gate 50c and between the second trench gate 50b and the third trench gate 50c in the substrate 1.

A conductive pattern 68 electrically connected to the gate electrode 50c may be disposed on the upper part of the substrate 1. The conductive pattern 68 may serve as an emitter electrode or a contact. A field stop area 72 may be provided on the lower surface of the substrate 1 opposite to the upper surface. The field stop area 72 may be an area highly doped with the second conductive type impurity. For example, the second conductive type impurity concentration in the field stop area 72 may be higher than the second conductive type impurity concentration in the drift area 10 of the second conductive type. A collector area 74 may be provided below the field stop area 72. The collector area 74 may be an area doped with the second conductive type impurity. A collector electrode 76 may be provided below the collector area 74.

Referring to FIGS. 6 and 7 together, the P/N balance of the buried layer under the first trench gate 50a and the second trench gate 50b is designed to be equal to or higher than the P/N balance of the buried layer under the third trench gate 50c so that the maximum electric field can be configured to be formed in the bottom area of the floating areas 30a and 30b.

Hereinafter, an aspect of the parasitic capacitance generated in the power semiconductor device according to an embodiment of the present invention will be described.

Referring to FIG. 8, which is a simulation image showing an aspect of a parasitic capacitance occurring in a longitudinal section along the X-axis shown in FIG. 5, the gate-emitter parasitic capacitance Cge is generated in an area including the interface between the gate electrodes 50a and 50b and the body area 42, and the gate-collector parasitic capacitance Cgc is generated in an area including the interface between the gate electrodes 50a and 50b and the drift area 10. In an area including the interface between the floating areas 30a and 30b located at the lower ends of the gate electrodes 50a and 50b and the drift area 10, the gate-collector parasitic capacitance Cgc occurs.

Referring to FIG. 9, which is a simulation image showing an aspect of a parasitic capacitance occurring in a longitudinal section along the Y-axis shown in FIG. 5, it can be confirmed that the gate-emitter parasitic capacitance Cge occurs at the upper end part of the side part of the third trench gate 50c and the gate-collector parasitic capacitance Cgc occurs at the lower end part of the side part of the third trench gate 50c.

Also, referring to FIG. 10 that enlarges a partial area shown in FIG. 5 illustrating a power semiconductor device according to an embodiment of the present invention having an active structure of a ladder cell fused with a closed cell structure and a stripe cell structure, the aspect of the parasitic capacitance occurring in the transverse section of the device can be confirmed. According thereto, it can be confirmed that the gate-emitter parasitic capacitance Cge is generated along the shape of a closed cell over an area including the interface between the gate electrode 50 and the emitter electrode 68, but the gate-collector parasitic capacitance Cgc is intensively generated along the area where the first trench gate 50a and the second trench gate 50b extend.

A power semiconductor device according to an embodiment of the present invention, in which the closed cell structure and the stripe cell structure described with reference to FIGS. 8 to 10 are fused has a structure in which both advantages of the switching and robustness of the closed cell and advantages of the static characteristic of the stripe cell can be achieved. According thereto, the switching characteristic can be stabilized by optimizing the size and the ratio of the parasitic capacitance, and the advantages of the static characteristics can be maintained through high channel density. For example, by freely adjusting the thickness and spacing of the first trench gate 50a, the second trench gate 50b, and the third trench gate 50c, the size and the ratio of the parasitic capacitance can be optimized.

Therefore, it can be understood that a power semiconductor device according to an embodiment of the present invention has a structure that fuses the advantages of a closed cell and a stripe cell of an IGBT so that it can minimize a negative gate capacitor configuration of a buried layer IGBT and it can obtain switching operation and parallel use stabilization through optimization of the ratio (Cgc:Cge) of the gate-collector parasitic capacitance Cgc to the gate-emitter parasitic capacitor Cge and on-resistance reduction due to channel density improvement.

Until now, in the ladder type active cell unit structure, a first trench gate and a second trench gate spaced apart from each other are formed and a plurality of third trench gates are positioned in a vertical direction. The lower part of each trench is protected by a buried layer. In the case of the third trench gate, the NP balance of the buried layer is formed stronger than that of the other buried layers. In channel formation of the ladder cell, the cross area of the trench and the MOS gain of the third trench gate can be formed lower than the gain of other MOS areas. The channel of the first trench gate and the second trench gate may be formed one or more but the mutual interference is minimized. In the ladder type edge structure, the edge in the horizontal direction is terminated by the third trench gate and the NP balance of the buried layer can be formed stronger than that of other buried layers.

According to an embodiment of the present invention as described above, it is possible to provide a power semiconductor device which can stabilize the switching characteristics by optimizing the size and the ratio of the parasitic capacitors and can realize the on-resistance reduction according to high channel density improvement. Of course, the scope of the present invention is not limited by these effects.

Although the present invention has been described with reference to the embodiments shown in the drawings, it is only illustrative, and it will be understood by those skilled in the art that various changes and modifications may be made without departing from the scope of the present invention. Accordingly, the true scope of the present invention should be determined by the technical idea of the appended claims.

What is claimed is:

1. A power semiconductor device comprising:
a first trench gate and a second trench gate in a stripe shape extending in one direction in parallel and spaced apart from each other in a substrate;
a third trench gate in a ladder shape extending in a direction different from the one direction between the first trench gate and the second trench gate in the substrate;
a first conductive type body area each disposed between the first trench gate, the second trench gate and the third trench gate, respectively, in the substrate;
a pair of first conductive type floating first areas surrounding each of bottom surfaces and at least one side of the first trench gate and the second trench gate in the substrate;
a first conductive type floating second area surrounding a bottom surface of the third trench gate in the substrate;
an emitter electrode disposed on an upper surface of the substrate and in contact with the first conductive type body area; and
a collector electrode disposed on a bottom surface of the substrate.

2. The power semiconductor device of claim 1, wherein a first trench gate and a second trench gate constituting one unit cell are connected to a first trench gate and a second trench gate constituting another unit cell immediately adjacent to the one unit cell without being separated from each other.

3. The power semiconductor device of claim 2, wherein in a plurality of unit cells disposed in series being adjacent to each other, the first trench gates are connected as one and provided across the plurality of unit cells, the second trench gates are connected as one and provided across the plurality of unit cells, and the third trench gate is provided as a plurality of trench gates connecting one of the first trench gates and one of the second trench gates and spaced apart from each other between one of the first trench gates and one of the second trench gates.

4. The power semiconductor device of claim 1, further comprising a second conductive type drift area disposed between the first conductive type floating area, the first conductive type body area, and the collector electrode in the substrate.

5. The power semiconductor device of claim 4, further comprising a second conductive type field stop area disposed between the second conductive type drift area and the collector electrode.

6. The power semiconductor device of claim 1, further comprising a pair of second conductive type source areas spaced apart from each other and respectively adjacent to the first trench gate and the second trench gate in a first conductive type body area disposed between the first trench gate and the second trench gate.

7. The power semiconductor device of claim 1, wherein a doping maximum depth of the first conductive type body area disposed between the first trench gate and the second trench gate is shallower than a depth of the first trench gate and the second trench gate, and a doping maximum depth of the floating first area of the first conductive type is deeper than a depth of the first trench gate and the second trench gate.

8. The power semiconductor device of claim 7, wherein a second conductive type doping concentration between the pair of first conductive type floating first areas and between the first trench gate and the second trench gate is relatively higher than a second conductive type doping concentration below the pair of first conductive type floating first areas in the drift area.

9. The power semiconductor device of any one of claims 1 to 8, wherein the second conductive type and the first conductive type have a conductive type opposite to each other, and are any one of n-type and p-type.

* * * * *